United States Patent [19]

Flükiger et al.

[11] Patent Number: 4,687,883
[45] Date of Patent: Aug. 18, 1987

[54] METHOD FOR PRODUCING SUPERCONDUCTIVE WIRES

[75] Inventors: Rene Flükiger, Karlsruhe; Stephen Gauss, Stuttgart, both of Fed. Rep. of Germany

[73] Assignee: Kernforschungszentrum Karlsruhe GmbH, Karlsruhe, Fed. Rep. of Germany

[21] Appl. No.: 904,975

[22] Filed: Sep. 8, 1986

[30] Foreign Application Priority Data

Sep. 6, 1985 [DE] Fed. Rep. of Germany ....... 3531769

[51] Int. Cl.$^4$ ............................................. H01B 5/00
[52] U.S. Cl. ......................... 174/126 S; 174/126 CP; 174/128 S; 29/599; 419/23; 419/38; 419/66; 148/11.5 Q; 148/11.5 P; 148/11.5 F; 148/11.5 C
[58] Field of Search .......... 174/126 S, 126 CP, 128 S; 29/599; 419/23, 38, 66; 148/11.5 Q, 11.5 P, 11.5 F, 11.5 C

[56] References Cited

U.S. PATENT DOCUMENTS

| | | | |
|---|---|---|---|
| 3,838,503 | 10/1974 | Svenaga et al. ................. | 174/126 S |
| 3,874,074 | 4/1975 | Meyer .............................. | 174/126 S |
| 3,918,998 | 11/1975 | Marancik et al. ................ | 174/126 S |
| 3,930,903 | 1/1976 | Randall et al. ................... | 174/126 S |
| 4,161,062 | 7/1979 | Agatsvma et al. ............... | 174/126 S |
| 4,262,412 | 4/1981 | McDonald ....................... | 174/126 S |
| 4,321,749 | 3/1982 | Tachikawa et al. ............. | 174/126 S |
| 4,411,959 | 10/1983 | Braginski et al. ................ | 174/126 S |
| 4,532,703 | 8/1985 | Verhoeven et al. ............. | 174/126 S |

FOREIGN PATENT DOCUMENTS 2909290  9/1980  Fed. Rep. of Germany .

OTHER PUBLICATIONS

E. Drost et al, "CRYOGENICS", vol. 24, No. 11, Nov. 1984.
IEEE Transactions on MAGNETICS, Sep. 1978, vol. MAG-14, No. 5 (J. D. Livingston).

Primary Examiner—Stephen J. Lechert, Jr.
Attorney, Agent, or Firm—Spencer & Frank

[57] ABSTRACT

The present invention relates to a method for producing multifilament superconductive wires of $Nb_3Sn$ or $V_3Ga$ filaments embedded in a Cu or Cu alloy matrix, with the wires containing metal additive elements from the group including Ti, Zr, Hf, V, Nb, Ta, Fe, Co, Ni in the filaments and/or in the matrix. The superconductive characteristics of the wires are predetermined for medium magnetic fields (below 12 T) as well as for high magnetic fields (12 T and above). The percentage of the additive (or additives) can be set to a predetermined value and thus the superconductive properties can be set as desired. This is accomplished by mixing metal additives in powder form with a powder of niobium or a niobium alloy, or of vanadium or a vanadium alloy, in a defined grain size and in a defined quantity. The resulting powder mixture is compacted in a container of copper or a copper alloy, the compacted container is shaped into a wire and, upon removal of the container layer, is processed further into wires. Depending on the desired superconductive properties, the final reaction heat treatment of the wires is performed at a selected temperature in a range from 500° C. to 1000° C. and at a selected heat treatment duration in a range from 48 to 300 hours.

20 Claims, 1 Drawing Figure

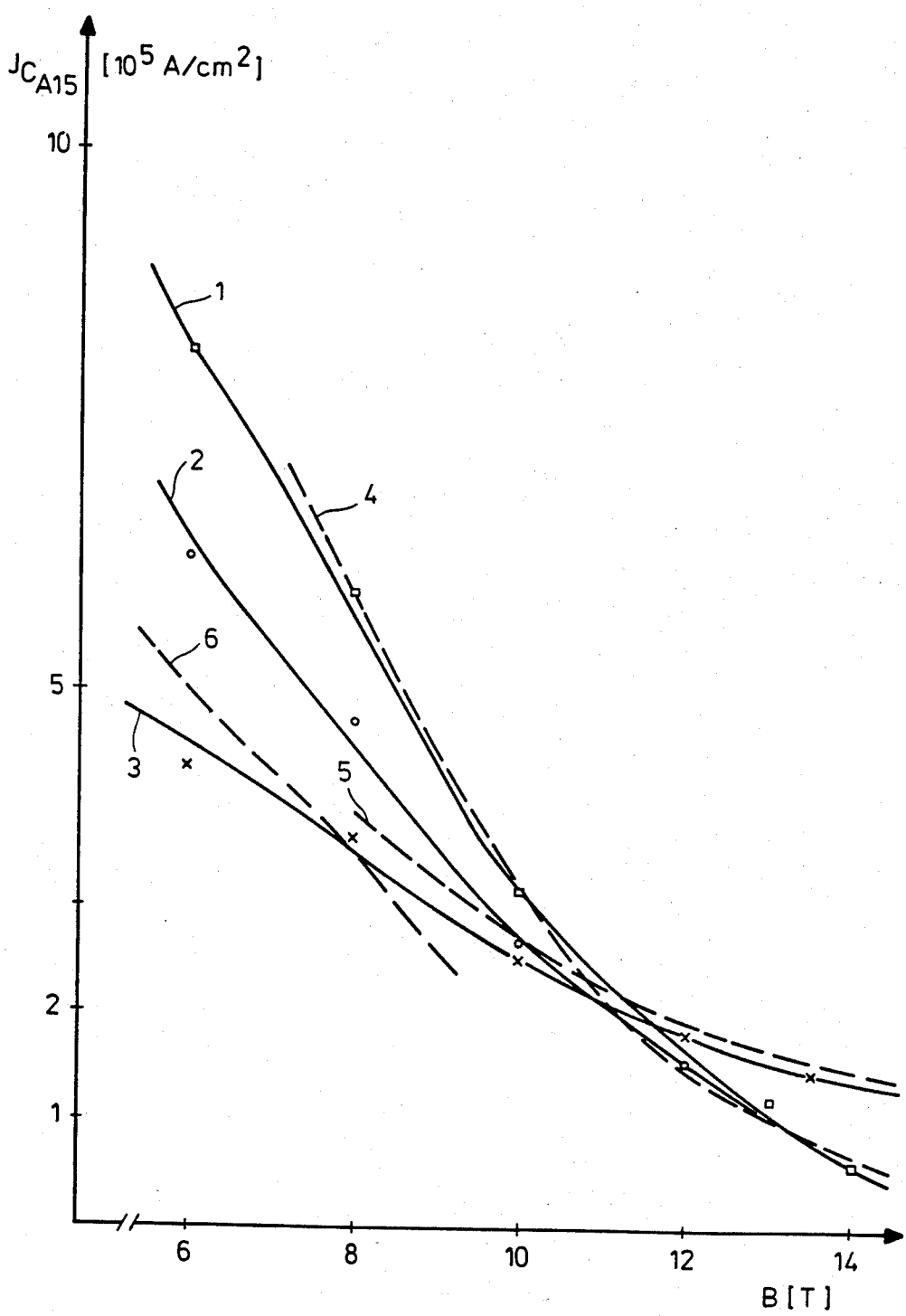

METHOD FOR PRODUCING SUPERCONDUCTIVE WIRES

BACKGROUND OF THE INVENTION

1. Field of the Invention

The present invention relates to a method for producing multifilament superconductive wires of $Nb_3Sn$ or $V_3Ga$ filaments having the A15 crystal structure embedded in a Cu or Cu alloy matrix, with the wires containing metal additive elements from the group including Ti, Zr, Hf, V, Nb, Ta, Fe, Co, Ni in the filaments and/or in the matrix, and the superconductive characteristics of the wires are predetermined for medium magnetic fields (below 12 Tesla (H=12T)) as well as for high magnetic fields (12 T and above). The starting materials, with or without cladding, are subjected to one or a plurality of repeated mechanical deformation steps and to a final reaction heat treatment in a temperature range between 500° C. and 1000° C.

2. Technology Review

Superconductive wires that are used to produce high magnetic fields (>12 T) are usually composed of $Nb_3Sn$ or $V_3Ga$ filaments embedded in a Cu or Cu alloy matrix. To improve their superconductive properties for high magnetic fields, ternary or quaternary additives have been added to the superconductive intermetallic compounds.

Multifilament superconductive wires based on bronze-$Nb_3Sn$ with ternary or quaternary additives of, for example, uranium, titanium, zirconium, hafnium, vanadium, tantalum, iron, nickel, palladium, aluminum or others, are disclosed in published European Patent Application No. 48,313. These additives serve to reduce the so-called prestress effect and are alloyed to the niobium and/or copper or to the bronze, respectively. This effect is a result of the different degree of contraction in the Cu-bronze and in the A15 filament during cooling from 1000° K. to 4.2° K. and primarily affects the current carrying capability for high magnetic fields. Primarily, the critical current density $J_c$ is thus reduced considerably compared to the voltage-free state. If the extraneous magnetic field is the same, the reduction is noticeably weakened by the additives.

Tantalum or also titanium and nickel are usually alloyed as additive elements into Nb or V starting material (0.3 to 30 weight % additive element). Since these elements are metals that have a high melting point, the alloys must be produced in an electron beam furnace. Melting processes performed in an electron beam furnace are very complicated and costly. To realize homogeneous distribution of the additive element, repeated remelting in the electron beam furnace is necessary.

SUMMARY OF THE INVENTION

The present invention to provides a method for producing multifilament superconductive wires of $Nb_3Sn$ or $V_3Ga$ filaments embedded in a Cu or Cu alloy matrix with which, on the one hand, the large amounts of time and energy required to introduce ternary or multinary additives into the superconductive compound are avoided and, on the other hand, the percentage of the additive (or additives) can be set to a predetermined value and thus the superconductive properties can be set as desired.

BRIEF DESCRIPTION OF THE DRAWING

The FIGURE illustrates the current carrying capabilities of wires produced according to the process of the invention (1 to 3) and wires produced by other processes (4 to 6).

DETAILED DESCRIPTION OF THE INVENTION

This is accomplished by the present invention in that (a) a powder of one or a plurality of metal additive elements or one or a plurality of alloys composed of at least two additive elements are mixed with a powder composed of ($a_1$) niobium; or
($a_2$) one or a plurality of Nb alloys from the group including Nb-Ta, Nb-Ti, Nb-Zr; or
($a_3$) vanadium: or
($a_4$) one or a plurality of V alloys from the group including V-Ta, V-Nb, V-Ti, V-Zr, with all powders having grain sizes in a range between 0.1 μm and 500 μm diameter and the percentage y of the additive metal(s) in the powder mixture corresponds to a weight percentage within the limits of $0.1 < y < 50$;

(b) the powder mixture obtained from a) is filled into a compactable and evacuatable container of copper or a copper alloy, the enclosed quantity of air is removed and then the powder mixture and the closed container are compacted jointly by means of simple or isostatic pressing until a powder density of more than 90% theoretical density (T.D.) is obtained;

(c) the compacted container is shaped in a known manner into a wire which has a diameter in a range from 0.5 mm to 15 mm and, after removing the outer Cu or Cu-alloy layer, is processed further, according to a known method, into $Nb_3Sn$ wires or $V_3Ga$ wires; and (d) depending on the desired superconductive properties, the final reaction heat treatment of the wires is performed at a selected temperature in a range from 500° C. to 1000° C. and for a selected duration in a range from 48 to 100 hours.

In an advantageous embodiment of the invention, the powder(s) of the additive element(s) and the powder containing Nb or V as a component have the same or similar ductilities as defined by the respective Vickers microhardness values not differing by more than factor 2.

The powder mixture is pressed in a Cu or Cu alloy tube and processed into a rod which is then processed further in the same manner as in the known methods.

With the known methods for producing $Nb_3Sn$ or $V_3Ga$ multifilament superconductive wires products are obtained which have critical current density of $10^4$ A/cm² at high magnetic fields (18 to 20 T).

To achieve homogeneous distribution, the additive material inclusions should be smaller than 0.5 μm. In the reaction heat treatment (about 500°–750° C., 3 to 10 days), in which the respective superconductive $Nb_3Sn$ or $V_3Ga$ phase is produced, the alloy with the additive material is simultaneously formed as a result of solid-state diffusion. Depending on the selection of the reaction conditions, more or less additive material is dissolved in the superconductive phase.

The process according to the invention can be used to produce ternary or quaternary superconductive wires, avoiding the complicated electron beam melting of the alloy (insofar as additive material is alloyed to the Nb core). Moreover, the percentage of additive material alloyed in is established only at the end of the manufacturing process, by the selection of the temperature and duration of the heat treatment.

The invention will be described in greater detail below with reference to an example. The example is intended to illustrate the process of the present invention, and not to limit the scope of the invention of the claims.

EXAMPLE

The samples were produced from niobium powder having grain sizes between 106 and 125 μm. Its Viokers hardness $H_V$ was about 85 kg/mm². The additive substance was tantalum powder (about 20 μm in diameter; $H_V$ 100–120 kg/mm²). Weighed quantities of powder were mixed and then carefully filled—so that the mixture did not degrade—through a funnel into a Cu-Zr tube which was closed at the bottom and had a length of about 7 cm and a diameter of 9 mm. To realize extensive compaction, the powder was already prepressed with about 200 Megapascal (MPa) when the tube was partially filled. The tube was closed by a Cr-Zr plug which was pressed in from the top at about 300 MPa (1 MPa = $10^6$ Newton/m² = 10 bar).

Thereafter, the wire was produced, primarily by hammering, in part also by rolling. To finely distribute the inclusions, it is necessary to reduce the cross sectional area to $R_a = 10^6$ ($R_a$ = cross section areal reduction rate). Because of the small diameters of the samples, it was necessary to bundle several conductors together. To do this, the cladding material was etched away with diluted nitric acid when the wire diameter was about 1 mm and then 19 pieces of the conductor were bundled in one Cu-Zr tube. The second bundling was made in a bronze tube which was then hammered to a final diameter of 0.6 mm.

The final reaction heat treatment in which the Nb₃Sn-A15 structure was produced, took place at temperatures between 675° C. and 750° C. and for a period in a range from 64 to 100 hours. The curves in the attached drawing figure (1 to 3 from the process according to the present invention; 4 to 6 from the prior art processes) show that the addition of 15 weight % Ta, with reference to the Nb+Ta percentage in the (Nb,Ta)₃Sn in conjunction with the reaction temperature and the reaction time permits the setting of predetermined properties for the superconductive wires for fields below 12 T as well as for fields of 12 T and above.

1. (85 weight % Nb, 15 weight % Ta; 675° C., 100 h)
2. (85 weight % Nb, 15 weight % Ta; 700° C., 64 h)
3. (85 weight % Nb, 15 weight % Ta; 750° C., 64 h)
4. (100 weight % Nb, i.e. Nb₃Sn without additive elements; 700° C., 64 h)
5. (92.5 weight % Nb, 7.5 weight % Ta; 700° C., 64 h)
6. (90.7 weight % Nb, 9.3 weight % Ta; 750° C., 96 h).

Curves 4 and 5 reflect the results from E. Drost, F. Flükiger, W. Specking, in Cryogenics 24, 622 (1984); curve 6 reflects the results from J. D. Livingston, IEEE Trans. Magn. MAG-14, 611 (1978). For reactions at temperatures below 700° C., current carrying capability values are obtained similarly to those of good binary conductors, above 700° C. as for ternary or multinary conductors.

The manufacturing process is simplified if the starting diameter is selected to be large enough so that bundling several wires is no longer necessary.

The processibility of the other known additive alloy materials (such as, for example, Ta, Ti, Zr, Hf, V, Fe, Co, Ni or Nb for V₃Ga) is similar to that of tantalum. Impurities from oxygen, carbon and nitrogen in the starting materials should be avoided. The Vickers hardnesses of the mixed powders are preferably approximately the same so that both types of powder will deform uniformly.

The manufacturing process described was performed according to the bronze method; however, the desired superconductive wire could also be produced according to the similar method of internal tin diffusion.

The invention described above is also described in patent application filed in the Federal Republic of Germany on Sept. 6th, 1985, application No. P 35 31 769.8, in our entire specification of which is incorporated herein by reference.

It is understood that various other modifications will be apparent to and can readily be made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for producing a superconductive wire, comprising steps for:
   mixing a first powder selected from the group consisting of:
   niobium;
   at least one niobium alloy of Nb-Ta, Nb-Ti, or Nb-Zr;
   vanadium; and
   at least one vanadium alloy of V-Ta, V-Nb, V-Ti, or V-Zr with an additive comprising, at least one elemental metal powder selected from the group consisting of Ti, Zr, Hf, V, Nb, Ta, Fe, Co, and Ni, or at least one metal alloy powder-consisting of at least two of said elemental metals each powder having a grain size between about 0.1 μm and about 500 μm in diameter, to form a powder mixture, said additive comprising from about 0.1% to about 50% by weight of said powder mixture,
   filling a copper or copper alloy container with said powder mixture, evacuating said container, and compacting said container and powder mixture to obtain a powder density of more than 90% T.D.,
   shaping said compacted container and powder mixture into a wire having a diameter from about 0.5 mm to about 15 mm, and removing said compacted container from said wire, and
   heating said wire to a temperature from about 500° C. to about 1000° C. for a period from about 48 to about 300 hours to obtain a superconductive wire.

2. The method set forth in claim 1 wherein said first powder and said additive have the same or similar ductility, as defined by the respective Vickers microhardness values not differing by more than factor 2.

3. The method set forth in claim 1 wherein said first powder is niobium.

4. The method set forth in claim 1 wherein said first powder is vanadium.

5. The method set forth in claim 1 wherein said first powder is at least one niobium alloy selected from the group consisting of Nb-Ta, Nb-Ti, or Nb-Zr.

6. The method set forth in claim 1 wherein said first powder is at least one vanadium alloy selected from the group consisting of V-Ta, V-Nb, V-Ti, and V-Zr.

7. The method set forth in claim 1 wherein said additive is at least one elemental metal powder.

8. The method set forth in claim 7, wherein said elemental metal powder is selected from the group consisting of Fe, Co, and Ni.

9. The method set forth in claim 7, wherein said elemental metal powder is Ta.

10. The method set forth in claim 7, wherein said elemental metal powder is Ti and Ni.

11. The method set forth in claim 1 wherein said additive is at least one metal alloy powder.

12. The method set forth in claim 11, wherein said metal alloy powder includes at least one metal selected from the group consisting of Fe, Co, and Ni.

13. The method set forth in claim 11, wherein said metal alloy powder comprises Ta.

14. The method set forth in claim 11, wherein said metal alloy powder comprises Ti and Ni.

15. The method set forth in claim 1 wherein said additive comprises from about 0.3 to about 30% by weight of said powder mixture.

16. The method set forth in claim 1 including heating said wire to a temperature from about 550° C. to about 750° C. for a period from about 72 to about 240 hours.

17. The method set forth in claim 16 including heating said wire to a temperature between about 675° C. and about 750° C. for a period from about 64 to about 100 hours.

18. The method set forth in claim 1 wherein said powder has a grain size between about 0.1 $\mu$m and about 0.5 $\mu$m in diameter.

19. The method set forth in claim 1 wherein said first powder and said additive have about the same Vickers hardnesses so that both deform uniformly.

20. A superconductive wire having a critical current density of $10^4$ A/cm$^2$ at a magnetic field of about 18 to 20 T produced by the method of claim 1.

* * * * *